(12) United States Patent
Micielli et al.

(10) Patent No.: US 12,506,474 B2
(45) Date of Patent: Dec. 23, 2025

(54) POWER SWITCH WITH PROTECTION AGAINST SAFE OPERATING AREA (SOA) VIOLATIONS

(71) Applicant: NXP USA, Inc., Austin, TX (US)

(72) Inventors: Christopher James Micielli, Austin, TX (US); Srikanth Jagannathan, Austin, TX (US)

(73) Assignee: NXP USA, Inc., Austin, TX (US)

( * ) Notice: Subject to any disclaimer, the term of this patent is extended or adjusted under 35 U.S.C. 154(b) by 215 days.

(21) Appl. No.: 18/452,365

(22) Filed: Aug. 18, 2023

(65) Prior Publication Data

US 2025/0062760 A1 Feb. 20, 2025

(51) Int. Cl.
*H02H 3/20* (2006.01)
*H02H 3/24* (2006.01)
*H03K 17/00* (2006.01)
*H03K 17/082* (2006.01)

(52) U.S. Cl.
CPC ......... *H03K 17/082* (2013.01); *H03K 17/002* (2013.01)

(58) Field of Classification Search
CPC .. H03K 17/082; H03K 17/002; H03K 17/102; H03K 17/687; H03K 19/017509; H03K 17/017509
USPC .............. 361/90, 56, 190; 327/379; 307/572
See application file for complete search history.

(56) References Cited

U.S. PATENT DOCUMENTS

| | | | |
|---|---|---|---|
| 5,245,230 A * | 9/1993 | Ohri | H03K 17/102 327/427 |
| 5,570,043 A | 10/1996 | Churchill | |
| 5,973,534 A * | 10/1999 | Singh | H03K 17/102 327/309 |
| 7,394,291 B2 | 7/2008 | Narwal et al. | |
| 7,936,209 B2 * | 5/2011 | Bhattacharya | H03K 19/018528 327/108 |
| 8,902,554 B1 | 12/2014 | Deo et al. | |
| 10,090,838 B2 | 10/2018 | Yang et al. | |
| 10,153,768 B1 | 12/2018 | Micielli et al. | |
| 10,748,890 B2 | 8/2020 | Kumar | |

OTHER PUBLICATIONS

U.S. Appl. No. 17/933,634, Mai, et al.: "Integrated Circuit (IC) Having an Analog Multiplexer (MUX)", filed Sep. 20, 2022.
U.S. Appl. No. 18/055,679, Mertens, et al.: "Cascoded Transistor Switch", filed Nov. 15, 2022.

* cited by examiner

*Primary Examiner* — Sean Kayes
*Assistant Examiner* — Lucy M Thomas
(74) *Attorney, Agent, or Firm* — Joanna G. Geld

(57) ABSTRACT

A power switch includes a first transistor and a second transistor, coupled in series between a first power supply voltage and a pad. The power switch also includes an analog multiplexer (MUX). The MUX is configured to provide a pad voltage to a control electrode of the first transistor when an overvoltage (OV) condition is detected on the pad, a second power supply voltage to the control electrode of the first transistor when an undervoltage (UV) condition is detected on the pad, and a reference voltage to the control electrode of the first transistor when neither the UV condition nor the OV condition is detected on the pad. The first power supply voltage is greater than the second power supply voltage, and the reference voltage is a fraction of the first power supply voltage.

17 Claims, 5 Drawing Sheets

POWER SWITCH WITH PROTECTION
AGAINST SAFE OPERATING AREA (SOA)
VIOLATIONS

BACKGROUND

Field

This disclosure relates generally to integrated circuits, and more specifically, to a power switch with protection against SOA violations and usable in an input/output (IO) circuit.

Related Art

The Safe Operating Area (SOA) of a device describes the maximum voltages across any two terminals of the device for the device to maintain reliable operation, and an SOA violation can result in damaging the device. In some cases, devices rated for lower voltages (referred to as low voltage or LV devices) are used in products which require high voltage operation or are used in high voltage environments. For example, in some applications (such as those using FinFETs), the SOA limit is 1.98V, in which an SOA violation occurs if the voltage across any two transistor terminals exceeds 1.98V.

In many applications, such as in automotive applications, a PCB with LV devices in the IO circuits are used in a system powered by higher battery voltage (e.g. 12V). Due to circuit failures or failures on the PCB level (such as shorts to battery, shorted or opened resistors, or ground shifts between PCBs), the pad voltages of the IO circuits may end up going as high as the battery voltage or to extreme negative voltages. While electrostatic discharge (ESD) diodes may be available with the IO circuits to clamp the pad voltages to a certain voltage above the power supply or below the ground of the IO circuit, this may not be sufficient for preventing SOA violations of the LV devices. Therefore, a need exists for power switches useable in an IO circuit with improved protection against SOA violations.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a power switch is provided which uses low voltage (LV) devices, but is capable at operating in higher voltage power domains. This may result in SOA violations during either overvoltage (OV) conditions or undervoltage (UV) conditions at a pad or other node of the power switch. In one example, the power switches are used to implement a general purpose input/output (GPIO) circuit, in which these OV and UV conditions may be caused by faults in a customer's PCB, which are typically out of the control of the SoC manufacturer. In one embodiment, a power switch includes a set of stacked LV devices. In order to reduce SOA violations, a gate voltage to a device of the stacked devices can be provided via an analog MUX which provides a desired gate voltage to the device based on whether an OV or UV condition is present, while appropriately blocking other voltages from the gate of the device. For example, in one embodiment, a voltage selected from a reference voltage, supply voltage, or an external pad voltage is provided via an analog MUX to the gate of the device. However, in doing so, appropriate gate voltages are provided to each device within the analog MUX to prevent SOA violations, regardless of whether or not an OV condition is present or a UV condition is present. In this manner, all LV devices within a circuit, such as a power switch or GPIO circuit, can be protected from SOA violations.

Figure 1:
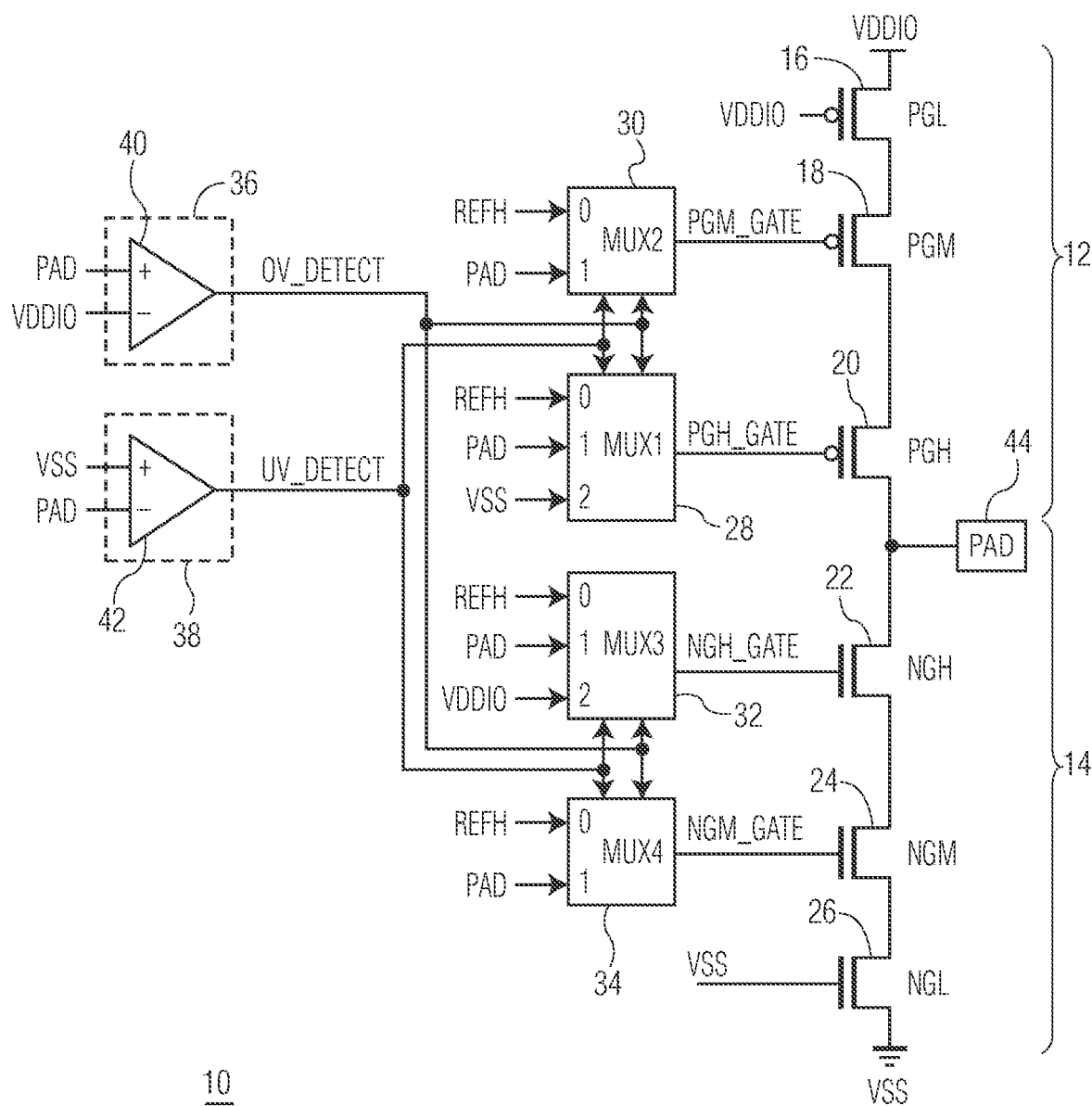
FIG. 1 illustrates, in block diagram form, an IO circuit including an N-channel metal-oxide-semiconductor (NMOS) power switch and a P-channel metal-oxide-semiconductor (PMOS) power switch, in accordance with one embodiment of the present invention.

FIG. 1 illustrates, in block diagram form, an IO circuit 10 including a P-channel Metal-Oxide-Semiconductor (PMOS) power switch 12 and an N-channel Metal-Oxide-Semiconductor (NMOS) power switch 14, in accordance with one embodiment of the present invention. FIG. 1 includes a first voltage supply terminal configured to provide a first supply voltage (VDDIO), a second voltage supply terminal configured to provide a second supply voltage (VSS) which is less than VDDIO, a third voltage supply terminal configured to provide a third supply voltage (REFH) which is less than VDDIO and greater then VSS, and a fourth voltage supply terminal configured to provide a fourth voltage supply (REFL) which is also less than VDDIO and greater than VSS. In one embodiment, REFH and REFL are high and low reference voltages, respectively, generated from VDDIO and VSS. Each of REFH and REFL are generated as a fraction (between 0 and 1) of VDDIO, such as, for example, (½)*VDDIO or VDDIO/2. In one embodiment, selecting REFH or REFL as a fraction of VDDIO means selecting REFH or REFL as a fraction of the maximum limit of VDDIO.

As used herein, it is assumed that REFH=REFL, but in alternate embodiments, they provide different voltages, each being a different fraction (between 0 and 1) of VDDIO (or of the maximum limit of VDDIO). For ease of description herein, each of the voltage supply terminals may instead be referred to by the provided voltage supply. For example, the first voltage supply terminal may simply be referred to as VDDIO.

In one embodiment, VDDIO is the operating voltage of the device including IO circuit 10, such as, for example, 3.3V, and VSS is 0V (i.e. ground). In one embodiment, REFH=REFL=VDDIO/2=3.6V/2=1.8V (in which 3.6V is the maximum limit of VDDIO and may be used to generate REFH and REFL). However, these are just example values and different embodiments may use different values depending on the design, but the relationship between them remains as VDDIO>REFL>VSS and VDDIO>REFH>VSS. As used herein, the NMOS and PMOS devices may be referred to as NMOS and PMOS transistors, respectively, or they may be referred to as transistors having an N-type conductivity type and a P-type conductivity type, respectively.

In the illustrated embodiment of FIG. 1, IO circuit 10 includes an IO pad 44, a PMOS power switch 12 (which may be referred to simply as switch 12), an NMOS power switch 14 (which may be referred to simply as switch 14), and multiplexers (MUXes) MUX1 28, MUX2, 30, MUX3, 32, and MUX4 34. PMOS switch 12 includes a PMOS transistor PGL 16, a PMOS transistor PGM 18, and a PMOS transistor PGH 20. In one embodiment, MUXes 28 and 30 may be considered to be part of switch 12. NMOS power switch 14 includes an NMOS transistor NGL 26, an NMOS transistor NGM 24, and an NMOS transistor NGH 22. In one embodiment, MUXes 32 and 34 may be considered to be part of switch 14. Note that PMOS power switch 12 and NMOS power switch 14 are each connected to pad 44 and may be referred to as complements to each other, in which PMOS power switch 12 switches between VDDIO and a high impedance state (Z) at its output node (pad 44), and NMOS power switch 14 switches between the high impedance state (Z) and VSS at its output node (pad 44).

As used herein, NMOS transistors 22, 24, and 26 may simply be referred to as transistors NGH, NGM, and NGL, respectively, and PMOS transistors 20, 18, and 16 as transistors PGH, PGM, and PGL, respectively. Each of MUXes 28, 30, 32, and 34 may simply be referred to as MUX1, MUX2, MUX3, and MUX4, respectively. Therefore, switch 12 includes a stack of three devices between pad 44 and VDDIO, including a high device (PGH) of the stack, a middle device (PGM) of the stack, and a low device (PGL) of the stack, and switch 14 includes a stack of three device between pad 44 and VSS, including a high device (NGH) of the stack, a middle device (NGM) of the stack, and a low device (NGL) of the stack. In this nomenclature, high, middle, and low refer to the relational position of the device within its corresponding stack between pad 44 and a power supply terminal (VDDIO or VSS). Note that pad 44 may also be referred to as the output node of IO circuit 10 (or the output node of switch 12 or the output node of switch 14). Note also that the voltage on pad 44 may simply be referred to as the pad voltage or as PAD.

Transistor PGH has a first current electrode (e.g. drain) coupled to pad 44, a second current electrode (e.g. source) connected to its body (i.e. tied to its body), and a control electrode (e.g. gate) coupled to receive an output voltage from MUX1 as PGH_GATE. A first input of MUX1 is coupled to receive REFH, a second input of MUX1 is coupled the output node to receive PAD, and a third input of MUX1 is coupled to receive VSS. A first current electrode (e.g. drain) of transistor PGM is coupled to the second current electrode of transistor PGH, a second current electrode (e.g. source) of transistor PGM is connected to its body (i.e. tied to its body), and a control electrode (e.g. gate) of transistor PGM is coupled to receive an output voltage from MUX2 as PGM_GATE. A first input of MUX2 is coupled to receive REFH, and a second input of MUX2 is coupled to the output node to receive PAD. Each of MUX1 and MUX2 are coupled to receive an overvoltage detection signal, OV_DETECT, from an overvoltage (OV) condition detection circuit 36 and an undervoltage detection signal, UV_DETECT, from an undervoltage (UV) condition detection circuit 38. Based on these detection signals, PGH_GATE is connected to one of the input signals of MUX1 and PGM_GATE is connected to one of the input signals of MUX2. A first current electrode (e.g. drain) of transistor PGL is coupled to the second current electrode of transistor PGM, a second current electrode (e.g. source) of transistor PGL is connected to its body (i.e. tied to its body) and to VDDIO, and a control electrode (e.g. gate) of transistor PGL is coupled to receive VDDIO.

Transistor NGH has a first current electrode (e.g. drain) coupled to pad 44, a second current electrode (e.g. source) connected to its body (i.e. tied to its body), and a control electrode (e.g. gate) coupled to receive an output voltage from MUX3 as NGH_GATE. A first input of MUX3 is coupled to receive REFH, a second input of MUX3 is coupled the output node to receive PAD, and a third input of MUX3 is coupled to receive VDDIO. A first current electrode (e.g. drain) of transistor NGM is coupled to the second current electrode of transistor NGH, a second current electrode (e.g. source) of transistor NGM is connected to its body (i.e. tied to its body), and a control electrode (e.g. gate) of transistor NGM is coupled to receive an output voltage from MUX4 as NGM_GATE. A first input of MUX4 is coupled to receive REFH, and a second input of MUX4 is coupled to the output node to receive PAD. Each of MUX3 and MUX4 are coupled to receive OV_DETECT and UV_DETECT, and based on these detection signals, NGH_GATE is connected to one of the input signals of MUX3 and NGM_GATE is connected to one of the input signals of MUX4. A first current electrode (e.g. drain) of transistor NGL is coupled to the second current electrode of transistor NGM, a second current electrode (e.g. source) of transistor NGL is connected to its body (i.e. tied to its body) and to VSS, and a control electrode (e.g. gate) of transistor NGL is coupled to receive VSS.

OV condition detection circuit 36 (also referred to as OV detection circuit) and UV condition detection circuit 38 (also referred to as UV detection circuit) may be considered to be part of IO circuit 10, or may be located outside of IO circuit 10 so that it may be shared among multiple IO circuits. OV detection circuit 36 asserts OV_DETECT to a logic level one when a voltage at pad 44 (PAD) is greater than VDDIO, and negates OV_DETECT to a logic level zero otherwise. UV detection circuit 38 asserts UV_DETECT to a logic level one when PAD is less than VSS, and negates UV_DETECT otherwise. In the illustrated embodiment, OV detection circuit 36 includes a comparator 40 having a non-inverting input coupled to receive PAD and an inverting input coupled to receive VDDIO, and an output which provides OV_DETECT. UV detection circuit 38 includes a comparator 42 having a non-inverting input coupled to receive VSS and an inverting input coupled to receive PAD, and an output which provides UV_DETECT.

In the description of FIGS. 1-4, note that a device may be described as a body-tied device in which a current electrode (e.g. source) is connected to (i.e. tied to) its body. However, these connections (the body ties) are not explicitly included in the drawings so as not to complicate the drawings. For example, referring to FIG. 2, each of PGH, PGM, PGL, NGH, NGM, and NGL has its source tied to its body, however, these connections are not illustrated in the drawings so as not to further complicate the drawings.

In operation, IO circuit 10, including both switches 12 and 14, is configured to, when enabled, generate an output on pad 44. For example, signals applied to the gates of PGL, PGM, PGH, NGH, NGM, and NGL may be set so as to turn on (i.e. enable) switch 12 while turning off (i.e. disabling) switch 14) in order to pull pad 44 up to VDDIO or turn on (i.e. enable) switch 14 while turning off (i.e. disabling) switch 12 in order to pull pad 44 down to VSS. In the former case, pad 44 outputs a logic level high and in the latter case, a logic level low. The control circuitry to generate the appropriate signals for the gates of the power switches and any enable/disable signals to drive the desired logic output on pad 44 is not illustrated in FIG. 2, but can be implemented using any circuitry as known in the art. However, if IO circuit 10 is disabled so as not to provide any output signal on pad 44, the signals applied to the gates of PGL, PGM, PGH, NGH, NGM, and NGL may be set to not turn on either switch 12 or switch 14 such that IO circuit 10 is not driving pad 44. In this case, pad 44 is in a high impedance state (represented as Z). In one embodiment, turning off (i.e. disabling) switches 12 and 14 is done by turning off each of PGL and NGL so that no current path is created between VDDIO and pad 44 nor between pad 44 and VSS. Therefore, in the illustrated embodiment, when switches 12 and 14 are disabled, the gate of PGL is configured to receive VDDIO and the gate of NGL is configured to receive VSS, such that each of PGL and NGL is turned off.

However, even though pad 44 is at Z with no power switch set to drive an output signal on pad 44, a voltage greater than VDDIO (an OV condition) or less than VSS (an UV condition) can appear on pad 44 (due, for example, to PCB circuit failures or other circuit failures). Therefore, the UV_DETECT and OV_DETECT signals are used by MUX1, MUX2, MUX3, and MUX4 to control the gate voltages of PGH, PGM, NGH, and NGM, respectively, to prevent any SOA violations. For example, in one embodiment, each of the stacked transistors in switches 12 and 14 are implemented as LV devices (e.g. FinFETs) in which an SOA violation occurs any time the voltage between any two terminals exceeds a maximum voltage, such as 1.98V. Therefore, an SOA violation occurs any time the gate-to-body voltage (Vgb), gate-to-source voltage (Vgs), gate-to-drain voltage (Vgd), or drain-to-source (Vds) exceeds 1.98V. As will be described in further detail in reference to FIGS. 2-4, each of the MUXes is also configured so as to prevent SOA violations within the MUXes as well.

IO circuit 10, as illustrated in FIG. 1, is configured to be in its disabled state in which both switches 12 and 14 are off such that pad 44 is at Z. While in this state, IO circuit 10 can experience an OV condition (in which PAD>VDDIO), a UV condition (in which PAD<VSS), or can be in normal operation (in which the PAD is in an acceptable range between VDDIO and VSS such that no OV condition or UV condition is present). Operation of each MUX will be described in reference to normal operation, an OV condition, and a UV condition.

MUX1 provides REFH as PGH_GATE (to the gate of PGH) when in normal operation (VSS≤PAD≤VDDIO), provides PAD as PGH_GATE when an OV condition is present (PAD>VDDIO), and provides VSS as PGH_GATE when a UV condition is present (PAD<VSS). MUX2 provides REFH as PGM_GATE (to the gate of PGM) when in normal operation as well as when a UV condition is present (PAD<VSS), but provides PAD as PGM_GATE when an OV condition is present (PAD>VDDIO). MUX3 provides REFH as NGH_GATE (to the gate of NGH) when in normal operation, provides PAD when a UV condition is present, and provides VDDIO when an OV condition is present. MUX4 provides REFH as NGM_GATE (to the gate of NGM) when in normal operation as well as when an OV condition is present, and provides PAD when a UV condition is present. In one embodiment, these voltages provided by the MUXes based on OV_DETECT and UV_DETECT eliminates any SOA violations during UV and OV conditions by preventing Vgb, Vgs, Vgd, or Vds of any of the devices of switches 12 and 14 (e.g. PGH, PGM, PGL, NGH, NGM, and NGL) from exceeding its maximum allowed voltage (e.g. 1.98V).

Figure 2:
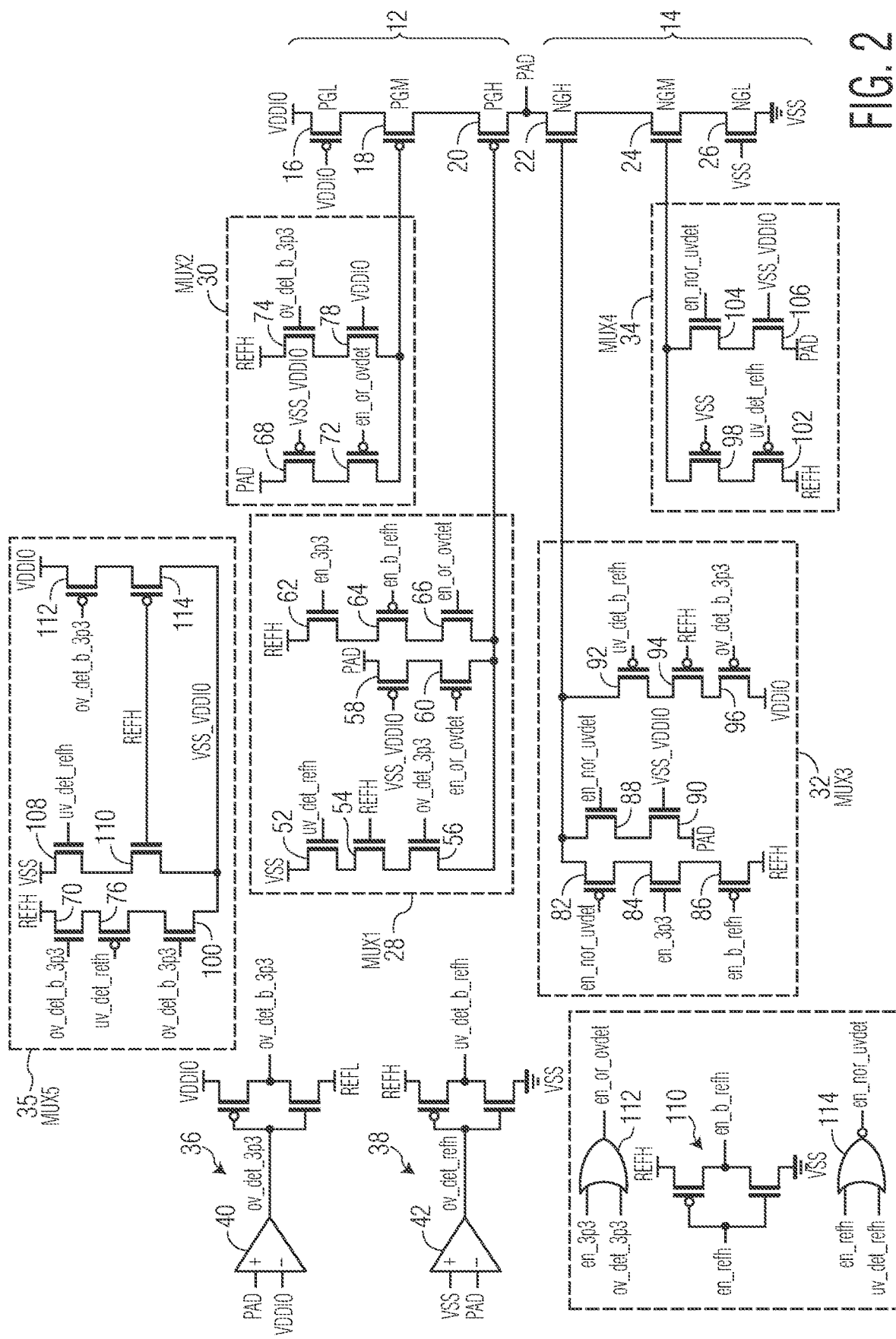
FIG. 2 illustrates, in partial block diagram and partial schematic form, the IO circuit of FIG. 1, in accordance with one embodiment of the present invention.

FIG. 2 illustrates, in partial schematic and partial block diagram form, a more detailed view of IO circuit 10, including more detailed views of OV detection circuit 36 and UV detection circuit 38. The illustrated embodiment of FIG. 2 includes example implementations for each of MUX1, MUX2, MUX3, and MUX4. The embodiment of FIG. 2 also includes an additional MUX MUX5 35 (referred to simply as MUX5). This MUX is used to provide VDDIO or VSS when there is a direct connection to pad 44, in order to further protect pad 44. In the illustrated embodiment of FIG. 2, each of the devices (PMOS or NMOS transistors) are all LV devices, and each is a body-tied device with its source tied to its body.

OV detection circuit 36 includes an inverter implemented with a PMOS transistor in series with an NMOS transistor between VDDIO and REFL. An input of the inverter is coupled to receive the output of comparator 40 as ov_det_3p3, and an output of the inverter provides the inverse of ov_det_3p3 as ov_det_b_3p3. Note that ov_det_3p3 has the same logic value as OV_DETECT, as described in reference to FIG. 1, but the inverter controls the voltage swing of the signal. For example, the signals ov_det_3p3 and ov_det_b_3p3 each toggle between VDDIO and REFL (in which, in the illustrated embodiment, REFL=REFH). Therefore, a logic level high for these signals is VDDIO while a logic level low is REFL (rather than VSS). Note that the use of a "_b" within the signal name indicates an inverse of the signal, and the "3p3" in the name represents the voltage of a logic level high (3.3V).

UV detection circuit 38 includes an inverter implemented with a PMOS transistor in series with an NMOS transistor between REFH and VSS. An input of the inverter is coupled to receive the output of comparator 42 as uv_det_refh, and an output of the inverter provides the inverse of uv_det_refh as uv_det_b_refh. Note that uv_det_refh has the same logic value as UV_DETECT, as described in reference to FIG. 1, but the inverter controls the voltage swing of the signal. For example, the signals uv_det_refh and uv_det_b_refh each toggle between REFH and VSS. Therefore, a logic level high for these signals is REFH (rather than VDDIO), and a logic level low is VSS. Note that the use of the "refh" in the name indicates the voltage of a logic level high (REFH).

IO circuit 10 also includes additional control circuitry including an inverter 110, and OR gate 112, and a NOR gate 114. Inverter 110 is coupled to receive an enable signal, en_refh, and configured to output the inverse of en_refh as en_b_refh. Therefore, signals en_refh and en_b_refh each toggle between REFH and VSS. A first input of NOR gate 114 is coupled to receive en_refh, and a second input of NOR gate 114 is coupled to receive uv_det_refh from UV detection circuit 38. An output of NOR gate 114 provides a UV detection enable signal, en_nor_uvdet, as "en_refh NOR uv_det_refh." Therefore, en_nor_uvdet also toggles between REFH and VSS. In operation, en_refh is asserted during normal operation (when neither an OV nor UV condition is present) and negated otherwise (when either an OV or UV condition is detected). In this manner, en_nor_uvdet is negated to VSS whenever a UV condition is detected or when in normal operation, and asserted otherwise (to REFH).

Continuing with the control circuitry of IO circuit 10, a first input of OR gate 112 is coupled to receive an enable signal, en_3p3, and a second input of OR gate 112 is coupled to receive ov_det_3p3 from OV detection circuit 36. An output of OR gate 112 provides an OV detection enable signal, en_or_ovdet, as "en_3p3 OR ov_det_3p3." In this example, en_3p3 toggles between VDDIO and REFL (in which REFL=REFH in the illustrated embodiment), and therefore, en_or_ovdet toggles between VDDIO and REFH as well. (Note that, in one embodiment, similar to en_refh, en_3p3 can also be coupled as an input to an inverter powered between VDDIO and REFL to control its voltage swing.) In operation, en_3p3 operates analogously to en_refh and is asserted during normal operation (when neither an OV nor UV condition is present) and negated otherwise (when either an OV or UV condition is detected). In this manner, en_or_ovdet is asserted to VDDIO when an OV condition is present or when in normal operation, and negated otherwise (to REFH).

In the illustrated embodiment of FIG. 2, MUX5 includes NMOS transistors 70, 100, 108 and 110 and PMOS transistors 76, 112, and 114. Transistors 70, 76, and 110 are stacked (e.g. coupled in series), transistors 108 and 110 are stacked (e.g. coupled in series), and transistors 112 and 114 are stacked (e.g. coupled in series). A first current electrode of transistor 70 is coupled to receive REFH, and a control electrode (e.g. gate) of transistor 70 is coupled to receive ov_det_b_3p3. A first current electrode of transistor 76 is coupled to a second current electrode of transistor 70, and a control electrode (e.g. gate) of transistor 76 is coupled to receive uv_det_refh. A first current electrode of transistor 100 is coupled to a second current electrode of transistor 76, and a control electrode (e.g. gate) of transistor 100 is coupled to receive ov_det_b_3p3. A second current electrode of transistor 100 is coupled to provide an output voltage VSS_VDDIO.

Continuing with MUX5, a first current electrode of transistor 110 is coupled to the second current electrode of transistor 100 and therefore also provides the output voltage VSS_VDDIO, and a control electrode (e.g. gate) is coupled to receive REFH. A first electrode of transistor 108 is coupled to a second current electrode of transistor 110, a control electrode (e.g. gate) of transistor 108 is coupled to receive uv_det_refh, and a second current electrode of transistor 108 is coupled to VSS. A first current electrode of transistor 114 is coupled the first current electrode of transistor 110 and therefore also provides the output voltage VSS_VDDIO. A control electrode (e.g. gate) of transistor 114 is coupled to receive REFH. A first current electrode of transistor 112 is coupled to a second current electrode of transistor 114, a control electrode (e.g. gate) is coupled to receive ov_det_b_3p3, and a second current electrode is coupled to VDDIO.

In operation of MUX5, when a UV condition is present, UV detection circuit 38 asserts uv_det_refh to a logic level one at REFH and OV detection circuit 36 negates ov_det_3p3. Therefore, ov_det_b_3p3 is asserted to a logic level high at VDDIO. In this case, with the source of transistor 108 at VSS and its gate at REFH, transistor 108 is on, and with the source and gate of transistor 112 both at VDDIO, transistor 112 is off. Transistor 110, with its gate at REFH, is also on. This results in providing VSS_VDDIO as VSS (i.e. in pulling VSS_VDDIO down to VSS).

Continuing with MUX5, when an OV condition is present, OV detection circuit asserts ov_det_3p3 to a logic level one at VDDIO, in which ov_det_b_3p3 is negated to a logic level zero at REFL (=REFH). UV detection circuit negates uv_det_refh to a logic level zero at VSS. In this case, with the source of transistor 112 at VDDIO and its gate at REFH, transistor 112 is on, and with source and gate of transistor 108 both at VSS, transistor 108 is off. Transistor 114, with its gate at REFH, is also on. This results in providing VSS_VDDIO as VDDIO (i.e. pulling VSS_VDDIO up to VDDIO).

During normal operation, in which neither an OV condition nor a UV condition is present, VSS_VDDIO is neither coupled to VSS or VDDIO since transistors 108 and 112 are both off due to uv_det_refh being negated at VSS and ov_det_b_3p3 being asserted at VDDIO. However, the stacked transistors 70, 76, and 100 are on (since ov_det_b_3p3 at the gate of transistor 70 is asserted to VDDIO, uv_det_refh at the gate of transistor 76 is negated to VSS, and ov_det_b_3p3 at the gate of transistor 100 is asserted to VDDIO). This results in REFH being provided as VSS_VDDIO.

In an alternate embodiment of MUX5, stacked transistors 70, 76, and 110, instead of being implemented as an NMOS, PMOS, and NMOS stack, respectively, as illustrated in FIG. 2, can be implemented as a PMOS, NMOS, and PMOS stack, respectively. In this alternate embodiment, transistor 70 would instead be a PMOS transistor and its control electrode would instead be coupled to receive uv_det_refh. Transistor 76 would instead be an NMOS transistor and its control electrode would instead be coupled to receive ov_det_b_3p3, and transistor 100 would instead be a PMOS transistor and its control electrode would instead be coupled to receive uv_det_refh. The resulting operation during normal operation would be analogous, regardless of whether the NMOS, PMOS, and NMOS stack or the PMOS, NMOS, PMOS stack were used for this branch of MUX5. For example, in this alternate embodiment, each transistor of the PMOS, NMOS, PMOS stack would be on during normal operation while transistors 108 and 112 are both off, thus also resulting in REFH being provided as VSS_VDDIO.

MUX1 includes three branches, one corresponding to each MUX input. A first branch of MUX1 is coupled to receive the first input, REFH, and includes NMOS transistors 62 and 66 and a PMOS transistor 64 coupled between REFH and the gate of PGH. In the illustrated embodiment, transistor 64 is coupled in series between transistors 62 and 66. A second branch of MUX1 is coupled to receive the second input, PAD, and includes PMOS transistors 58 and 60 coupled in series between PAD and the gate of PGH. A third branch of MUX1 is coupled to receive the third input, VSS, and includes NMOS transistors 52, 54, and 56 coupled in series between VSS and the gate of PGH. Therefore, in operation, MUX1 provides one of VSS, PAD, or REFH as PGH_GATE to the gate of PGH, based at least in part on the outputs of OV detection circuit 36 and UV detection circuit 38.

In the first branch of MUX1, a first current electrode of transistor 62 is coupled to receive REFH, and a gate of transistor 62 is coupled to receive en_3p3. A first current electrode of transistor 64 is coupled to a second current electrode of transistor 62, and a control electrode (e.g. gate) of transistor 64 is coupled to receive en_b_refh. A first current electrode of transistor 66 is coupled to a second current electrode of transistor 64, a control electrode (e.g. gate) of transistor 66 is coupled to receive en_or_ovdet, and a second current electrode of transistor 66 is coupled to the output of MUX1 (i.e. the gate of PGH).

In the second branch of MUX1, a first current electrode of transistor 58 is coupled to receive PAD, and a control electrode (e.g. gate) is coupled to receive VSS_VDDIO. A first current electrode of transistor 60 is coupled to a second current electrode of transistor 58, a control electrode (e.g. gate) of transistor 60 is coupled to receive en_or_ovdet, and a second current electrode of transistor 60 is coupled to the output of MUX1 (i.e. the gate of PGH).

In the third branch of MUX1, a first current electrode of transistor 52 is coupled to receive VSS, and a gate of transistor 62 is coupled to receive uv_det_refh. A first current electrode of transistor 54 is coupled to a second current electrode of transistor 52, and a control electrode (e.g. gate) of transistor 64 is coupled to receive REFH. A first current electrode of transistor 56 is coupled to a second current electrode of transistor 54, a control electrode (e.g. gate) of transistor 56 is coupled to receive ov_det_3p3, and a second current electrode of transistor 56 is coupled to the output of MUX1 (i.e. the gate of PGH).

MUX2 includes two branches, one corresponding to each MUX input. A first branch of MUX2 is coupled to receive the first input, REFH, and includes NMOS transistors 74 and 78 coupled in series between REFH and the gate of PGM. A second branch of MUX2 is coupled to receive the second input, PAD, and includes PMOS transistors 68 and 72 coupled in series between PAD and the gate of PGM. Therefore, in operation, MUX2 provides one of PAD or REFH as PGM_GATE to the gate of PGM, based at least in part on the output of OV detection circuit 36.

In the first branch of MUX2, a first current electrode of transistor 74 is coupled to receive REFH, and a gate of transistor 74 is coupled to receive ov_det_b_3p3. A first current electrode of transistor 78 is coupled to a second current electrode of transistor 74, a control electrode (e.g. gate) of transistor 78 is coupled to receive VDDIO, and a second current electrode of transistor 78 is coupled to the output of MUX2 (i.e. the gate of PGM).

In the second branch of MUX2, a first current electrode of transistor 68 is coupled to receive PAD, and a gate of transistor 68 is coupled to receive VSS_VDDIO. A first current electrode of transistor 72 is coupled to a second current electrode of transistor 68, a control electrode (e.g. gate) of transistor 72 is coupled to receive en_or_ovdet, and a second current electrode of transistor 72 is coupled to the output of MUX2 (i.e. the gate of PGM).

MUX3 includes three branches, one corresponding to each MUX input. A first branch of MUX3 is coupled to receive the first input, REFH, and includes NMOS transistor 84 and PMOS transistors 82 and 86 coupled between the gate of NGH and REFH. In the illustrated embodiment, transistor 84 is coupled in series between transistors 82 and 86. A second branch of MUX3 is coupled to receive the second input, PAD, and includes NMOS transistors 88 and 90 coupled in series between the gate of NGH and PAD. A third branch of MUX3 is coupled to receive the third input, VDDIO, and includes PMOS transistors 92, 94, and 96 coupled in series between the gate of NGH and VDDIO. Therefore, in operation, MUX3 provides one of VDDIO, PAD, or REFH as NGH_GATE to the gate of NGH, based at least in part on the outputs of OV detection circuit 36 and UV detection circuit 38.

In the first branch of MUX3, a first current electrode of transistor 86 is coupled to receive REFH, and a gate of transistor 86 is coupled to receive en_b_refh. A first current electrode of transistor 84 is coupled to a second current electrode of transistor 86, and a control electrode (e.g. gate) of transistor 84 is coupled to receive en_3p3. A first current electrode of transistor 82 is coupled to a second current electrode of transistor 84, a control electrode (e.g. gate) of transistor 82 is coupled to receive en_nor_uvdet, and a second current electrode of transistor 82 is coupled to the output of MUX3 (i.e. the gate of NGH).

In the second branch of MUX3, a first current electrode of transistor 90 is coupled to receive PAD, and a control electrode (e.g. gate) is coupled to receive VSS_VDDIO. A first current electrode of transistor 88 is coupled to a second current electrode of transistor 90, a control electrode (e.g. gate) of transistor 90 is coupled to receive en_nor_uvdet, and a second current electrode of transistor 88 is coupled to the output of MUX3 (i.e. the gate of NGH).

In the third branch of MUX3, a first current electrode of transistor 96 is coupled to receive VDDIO, and a gate of transistor 96 is coupled to receive ov_det_b_refh. A first current electrode of transistor 94 is coupled to a second current electrode of transistor 96, and a control electrode (e.g. gate) of transistor 94 is coupled to receive REFH. A first current electrode of transistor 92 is coupled to a second current electrode of transistor 94, a control electrode (e.g. gate) of transistor 92 is coupled to receive uv_det_b_refh, and a second current electrode of transistor 92 is coupled to the output of MUX3 (i.e. the gate of NGH).

MUX4 includes two branches, one corresponding to each MUX input. A first branch of MUX2 is coupled to receive the first input, REFH, and includes PMOS transistors 98 and 102 coupled in series between the gate of NGM and REFH. A second branch of MUX2 is coupled to receive the second input, PAD, and includes NMOS transistors 104 and 106 coupled in series between the gate of NGM and PAD. Therefore, in operation, MUX4 provides one of PAD or REFH as NGM_GATE to the gate of NGM, based at least in part on the output of UV detection circuit 38.

In the first branch of MUX4, a first current electrode of transistor 102 is coupled to receive REFH, and a control electrode (e.g. gate) of transistor 102 is coupled to receive uv_det_refh. A first current electrode of transistor 98 is coupled to a second current electrode of transistor 102, a control electrode (e.g. gate) of transistor 98 is coupled to receive VSS, and a second current electrode of transistor 98 is coupled to the output of MUX4 (i.e. the gate of NGM).

In the second branch of MUX4, a first current electrode of transistor 106 is coupled to receive PAD, and a gate of transistor 106 is coupled to receive VSS_VDDIO. A first current electrode of transistor 104 is coupled to a second current electrode of transistor 106, a control electrode (e.g. gate) of transistor 104 is coupled to receive en_nor_uvdet, and a second current electrode of transistor 104 is coupled to the output of MUX4 (i.e. the gate of NGM).

Note that in an alternate embodiment in which REFL is different from REFH, the REFH connections in MUX3 and MUX4 can be replaced with REFL connections instead. For example, the first input of each of MUX3 and MUX4 may be coupled to receive REFL instead of REFH. Also, note that when transistor in a branch of a MUX (such as MUX1-MUX4) is directly connected to pad 44 (to receive the voltage, PAD), the gate of that transistor is connected to VSS_VDDIO rather than being directly connected to the power supply terminal to receive VSS or VDDIO. For example, this applies to transistors 58, 68, 90, and 106, whose gates are coupled to receive VSS_VDDIO from MUX5. In this manner, MUX5 (e.g. an analog MUX) can provide the appropriate analog voltage (VSS, VDDIO, REFH), as needed, without corrupting these supply voltages.

Operation of MUX1 and MUX2 will be described first in reference to switch 12 (the P-side of IO circuit 10), with respect to FIG. 1. For example, without MUX1 and MUX2, the gates of PGM and PGH could simply be connected to receive a reference voltage between VDDIO and VSS (such as REFH=1.8V). The use of stacked gates such as PGL, PGM, and PGH prevents SOA voltage violations on these transistors. For example, in the case in which VDDIO is 3.3V and switch 12 is turned off (with VDDIO on the gate of PGL), so long as the pad voltage (PAD) is within an acceptable range for normal operation (VSS≤PAD≤VDDIO), no SOA violations appear across any terminals of any of the transistors. That is, PGL, PGM, and PGH are all protected from experiencing any voltage greater than the maximum voltage rating (e.g. 1.98V) across of any of its terminals.

However, in an example of an UV condition, PAD is less than VSS (e.g. at −1V), and if the gate of PGH were simply connected to receive REFH, the Vgd of PGH would reach 2.8V which is an SOA violation on PGH, risking damage to PGH. With MUX1, though, with detection of a UV condition, VSS (rather than REFH) is provided to the gate of PGH (while MUX2 still provides REFH to the gate of PGM). With VSS applied to the gate of PGH, the Vgd of PGH is limited to only 1 volt, which is within the SOA limits of the device.

In an example of an OV condition, PAD is instead greater than VDDIO (e.g. at 4.3V), and if the gates of PGM and PGH were simply connected to receive REFH, the Vgd and Vgs of PGH as well as the Vgd and Vgs of PGM would each reach 2.5V, which present SOA violations. With MUX1 and MUX2, though, upon detection of an OV condition, the pad voltage PAD (rather than REFH) is applied to each of the gates of PGM and PGH. With PAD being fed back to the gates of PGM and PGH, the Vgd and Vgs voltages of PGM and PGH are limited to 0V.

Note that the complement is true for switch 14 (the N-side of IO circuit 10). For example, while REFH or REFL could be provided to the gates of NGH and NGM to protect these transistors from SOA violations during normal operation in which switch 14 is off and the pad voltage remains in its acceptable range. However, SOA violations would occur if REFH or REFL were used during the occurrence of a UV or OV condition. Therefore, during a UV condition, MUX3 and MUX4 each provide PAD to the gates of NGH and NGM, respectively, and during an OV condition, MUX3 provides VDDIO to the gate of NGH (while MUX4 still provides REFH to the gate of NGM). In this manner, during an OV or UV condition, the transistors of switch 14 are protected from SOA violations.

In one embodiment, the transistors used to implement each of the MUXes are also LV devices in which, for example, the maximum voltage limit for these devices is the same as for the devices in power switch 12 and 14. For example, a voltage of 1.98V or greater across any two terminals of any device within any of the MUXes results in an SOA violation, risking damage of those devices. FIG. 2 illustrates an embodiment which implements each of the MUXes in such a way as to prevent SOA violations within the MUXes as well. For example, operation of FIG. 2 will be described in more detail in reference to FIG. 3 (which represents voltage values applied during an UV condition), FIG. 4 (which represents voltage values applied during an OV condition), and FIG. 5 (which represents voltage values applied during normal operation). As used in the descriptions which follow, note that each of the first and second current electrodes of any of the PMOS or NMOS transistors within the MUXes may generally be referred to as the source region, drain region, source/drain (S/D) region, or S/D of the transistor.

Figure 3:
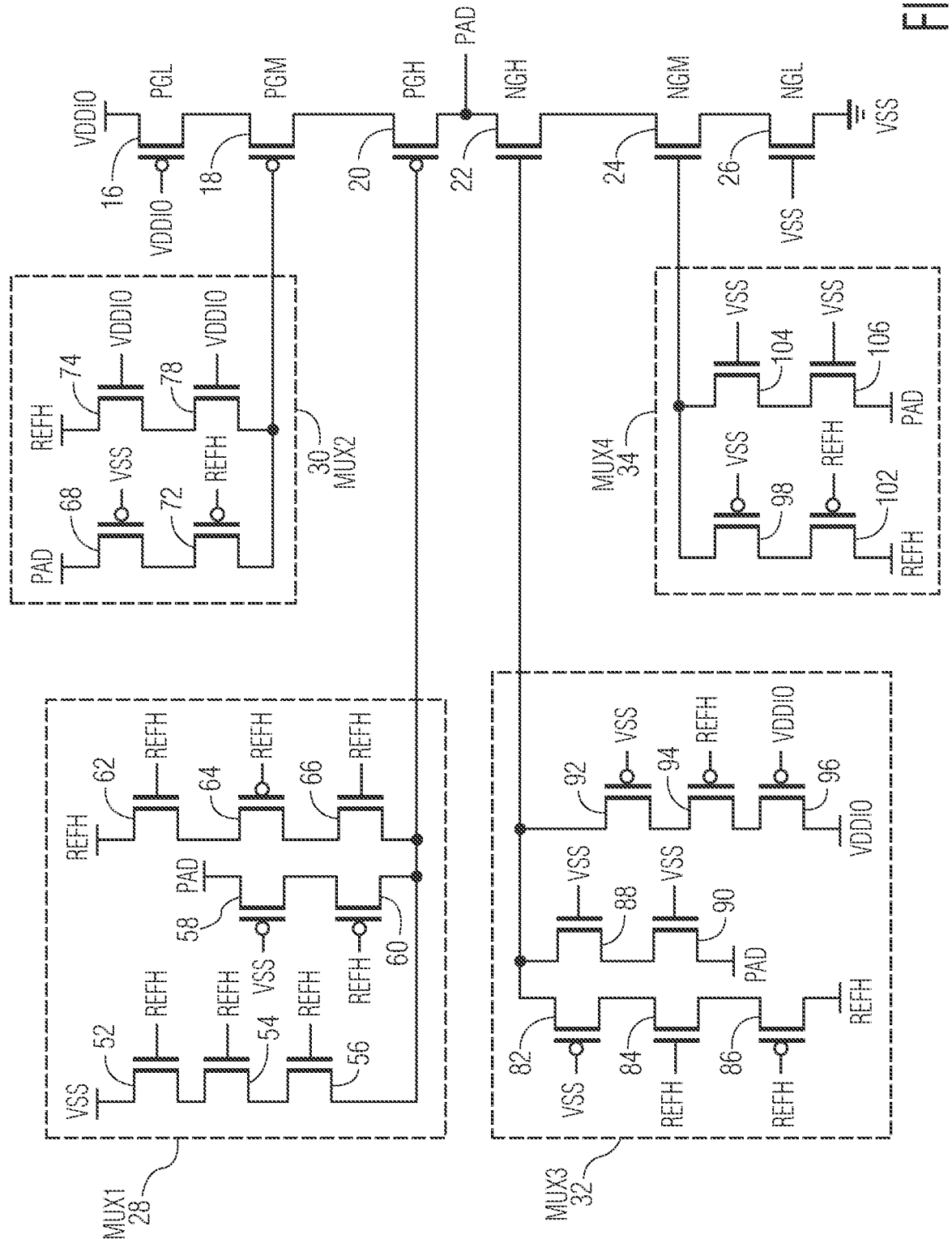
FIG. 3 illustrates, in schematic form, the IO circuit of FIG. 2 with various voltage levels provided during an undervoltage (UV) condition, in accordance with one embodiment of the present invention.

Referring first to FIG. 3, VDDIO is applied to the gate of PGL and VSS to the gate of NGL, which turns off switches 12 and 14, resulting in setting pad 44 to the high impedance state. However, pad 44 may see a voltage resulting in a UV condition (in which PAD<VSS). In this case, the gates coupled to receive VSS_VDDIO receive VSS (from MUX5). The signal uv_det_refh is asserted to REFH and the inverse, uv_det_b_refh, is negated to VSS. This results in en_nor_uvdet being negated to VSS. The signal ov_det_3p3 is negated to REFL (=REFH in the illustrated embodiment), and the inverse, ov_det_b_3p3, is asserted to VDDIO. The signal en_3p3 is also negated to REFH during a UV condition. This results in en_or_ovdet also being negated to REFH.

Therefore, referring first to MUX1, the UV condition results in applying REFH to the gates of each of transistors 52, 54, and 56, and with PAD being less than VSS (e.g. at −1V), each of transistors 52, 54, and 56 is turned on to provide VSS to the gate of PGH. With respect to transistors 58 and 60, with VSS applied to the gate of transistor 58, REFH to the gate of transistor 60, and PAD<VSS, they are all turned off. With the gates of transistors 62, 64, and 66 each receiving REFH, they are all turned off as well. However, the gate voltages on transistors 58, 60, 62, 64, and 66 are selected so as to prevent an SOA violations across any pair of terminals of these transistors. For example, applying REFH to the gates of 60, 62, 64, and 66, SOA violations are prevented, even with PAD being less than VSS. Referring to MUX2, the UV condition results in applying VDDIO to each of the gates of transistors 74 and 78. Therefore, MUX2 provides REFH via transistors 74 and 78 to the gate of PGM. With PAD being less than VSS, applying VSS to the gate of 68 turns it off, and applying REFH to the gate of 72 turns transistor 72 off as well. However, by applying REFH (rather than a higher voltage such as VDDIO) to the gate of transistor 72, they are protected from SOA violations.

Referring to MUX3, for an UV condition, VSS is applied to transistors 88 and 90, and with PAD being less than VSS, transistors 88 and 90 are turned on so as to provide PAD to the gate of NGH. With REFH applied to the gate of transistor 86, it is turned off, blocking REFH from the output of MUX3 (i.e. the gate of NGH). Similarly, with VDDIO applied to the gate of transistor 96 and REFH applied to the gate of transistor 94, transistors 94 and 96 are off, blocking VDDIO from the output of MUX3 (from the gate of NGH). Referring to MUX4, with VSS applied to transistors 104 and 106 when PAD is less than VSS, transistors 104 and 106 are both turned on, passing PAD via transistors 104 and 106 to the gate of NGM. With REFH at the gate of transistor 102, REFH is blocked form the output of MUX4. As in MUX1 and MUX2, the gate voltages on any of the transistors are selected so as to prevent any SOA violations.

Figure 4:
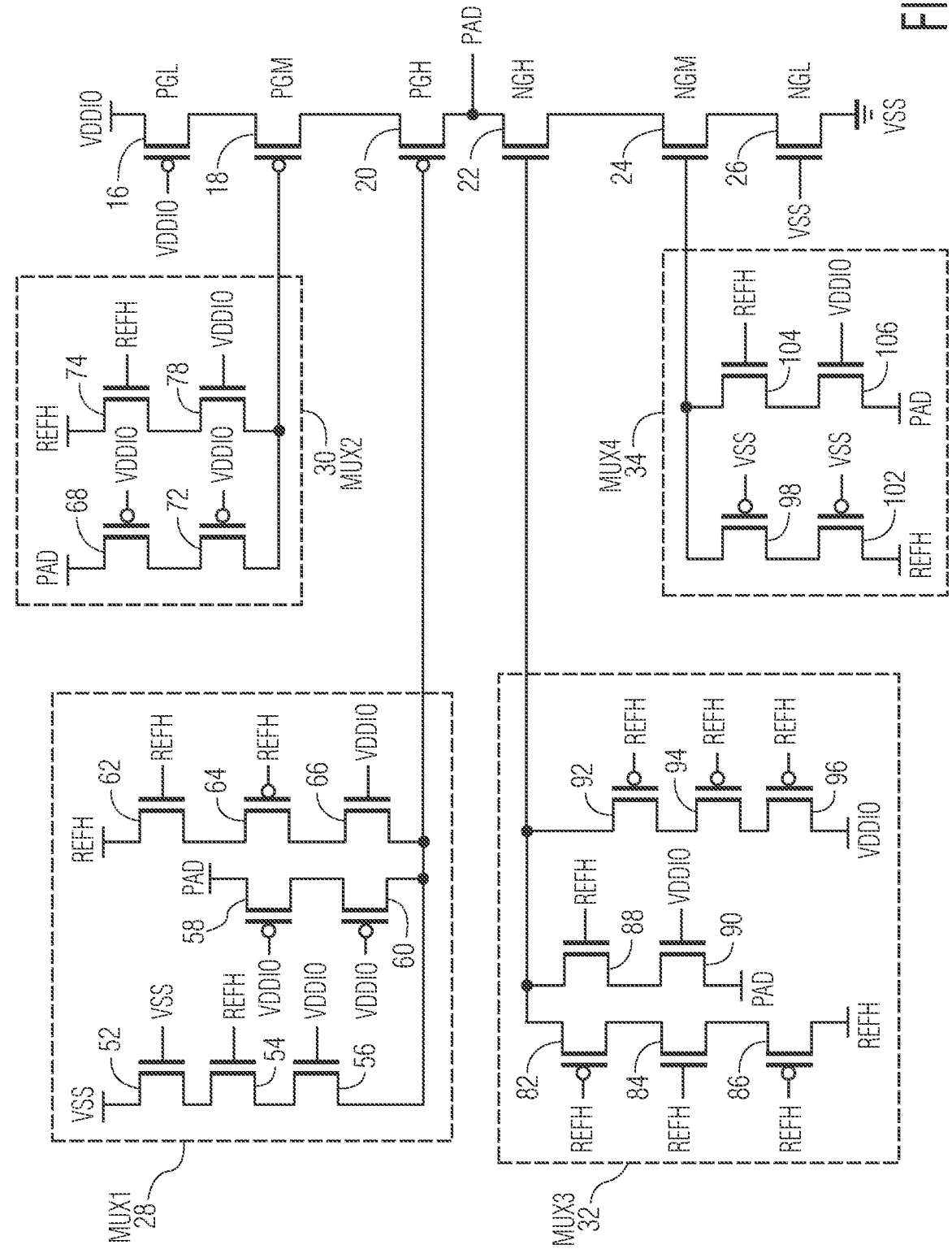
FIG. 4 illustrates, in schematic form, the IO circuit of FIG. 2 with various voltage levels provided during an overvoltage (UV) condition, in accordance with one embodiment of the present invention.

Referring next to FIG. 4, it is assumed that a voltage on pad 44 results in an OV condition (in which PAD>VDDIO). In this case, the gates coupled to receive VSS_VDDIO receive VDDIO (from MUX5). The signal ov_det_3p3 is asserted to VDDIO (e.g. 3.3V), and the inverse, ov_det_b_3p3, is negated to REFL (=REFH in the illustrated embodiment). This results in en_or_ovdet being asserted to VDDIO. The signal uv_det_refh is negated to VSS and the inverse, uv_det_b_refh, is asserted to REFH. The signal en_refh is also negated to VSS during an OV condition. This results in en_nor_uvdet being asserted to REFH.

Therefore, referring to MUX1, the OV condition results in applying VDDIO to the gates of transistors 58 and 60, and with PAD being greater than VDDIO (e.g. at 4.3V), each of transistors 58 and 60 is turned on to provide PAD to the gate of PGH. With respect to transistors 52, 54, and 56, with VDDIO applied to the gate of transistor 56 and PAD>VDDIO, transistor 56 is turned off, blocking VSS from the output of MUX1, and with the gate of transistor 66 also receiving VDDIO, it is turned off as well, blocking REFH from the output of MUX1 (from the gate of PGH). However, the gate voltages on the remaining transistors (e.g. 52, 54, 62, and 64) are selected so as to prevent an SOA violations across any pair of terminals of these transistors. Therefore, VSS is provided to the gate of transistor 52, and REFH to the gates of transistors 54, 62, and 64. Referring to MUX2, the OV condition results in applying VDDIO to each of the gates of transistors 68 and 72. Therefore, MUX2 provides PAD via transistors 68 and 72 to the gate of PGM. With PAD being greater than VDDIO, applying VDDIO to the gate of transistor 78 turns it off, and applying REFH to the gate of transistor 74 turns it off as well. However, by applying REFH (rather than a lower voltage such as VSS) to the gate of transistor 74, it is protected from SOA violations.

Referring to MUX3, for an OV condition, REFH is applied to the gates of each of transistors 92, 94, and 96, and with PAD being greater than VDDIO, these transistors are turned on so as to provide VDDIO to the gate of NGH. With REFH applied to the gates of transistors 82, 84, and 86 while PAD>VDDIO, these are turned off, blocking REFH from the output of MUX3. Similarly, with REFH applied to the gate of transistor 88, VDDIO to the gate of transistor 90, and PAD greater than VDDIO, transistors 88 and 90 are turned off, blocking PAD from the output of MUX3. Referring to MUX4, with VSS applied to transistors 98 and 102, these transistors are turned on, passing REFH via these transistors to the gate of NGM. With VDDIO at the gate of transistor 106, REFH at the gate of transistor 104, and PAD greater than VDDIO, transistors 104 and 106 are turned off, thus blocking PAD from the output of MUX4 (from the gate of NGH). As in MUX1 and MUX2, the gate voltages on any of the transistors are selected so as to prevent any SOA violations.

Figure 5:
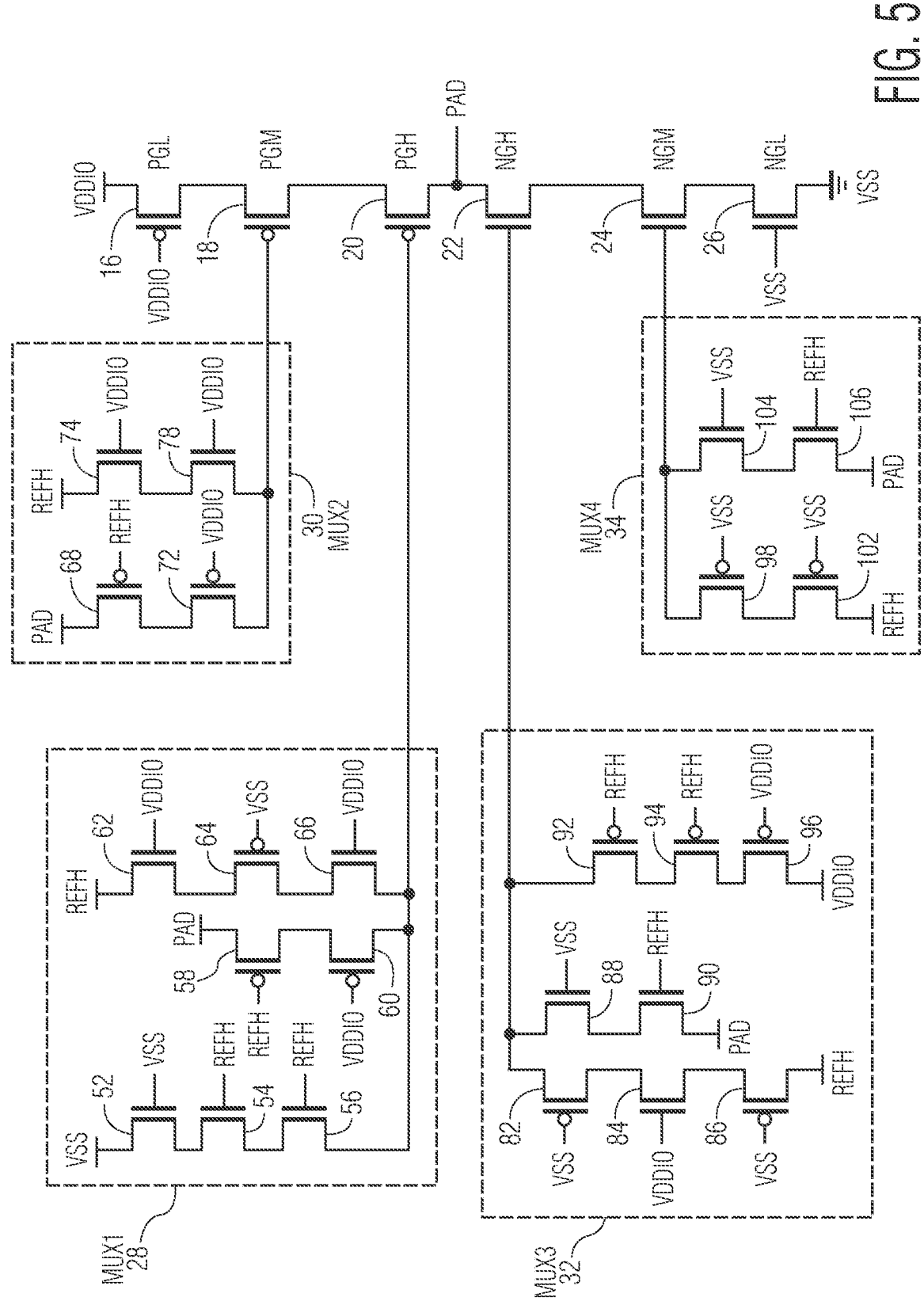
FIG. 5 illustrates, in schematic form, the IO circuit of FIG. 2 with various voltage levels provided during normal operation (without a UV or OV condition present), in accordance with one embodiment of the present invention.

Referring next to FIG. 5, it is assumed that normal operation is occurring in which a voltage on pad 44 is between VSS and VDDIO (e.g. VSS≤PAD≤VDDIO) such that no OV condition is detected and no UV condition is detected. In this case, the gates coupled to receive VSS_VDDIO receive REFH (from MUX5). The signal en_3p3 is asserted to VDDIO (e.g. 3.3V), and this results in en_or_ovdet being asserted to VDDIO. The signal en_refh is asserted to REFH, and this results in en_nor_uvdet being negated to VSS.

Therefore, referring to MUX1, during normal operation, VDDIO is applied to the gates of transistors 62 and 66, and VSS to the gate of transistors 64, turning them all on to provide REFH to the gate of PGH. With VDDIO applied to the gate of transistor 60, and REFH to the gate of transistor 58, these are both off, blocking PAD from the gate of PGH. With respect to transistors 52, 54, and 56, with VSS applied to the gate of transistor 52, transistor 52 is turned off, blocking VSS from the output of MUX1 (from the gate of PGH). The gate voltages on the transistors of MUX 1 are selected so as to prevent an SOA violations across any pair of terminals of these transistors. Therefore, REFH is provided to the gates of transistors 54, 56, 58, and 60. Referring to MUX2, during normal operation, with VDDIO provided to the gates of transistors 74 and 78, these are on, providing REFH to the gate of PGM. With VDDIO applied to the gate of transistor 72, transistor 72 is off, blocking PAD from the gate of PGM. Also, by applying REFH to the gate of transistor 68, it is protected from SOA violations.

Referring to MUX3, during normal operation, VSS is applied to the gates of transistors 82 and 86, and VDDIO to the gate of transistors 84, turning them all on to provide REFH to the gate of NGH. With VSS applied to the gate of transistor 88, transistor 88 is turned off, blocking PAD from the gate of NGH. With respect to transistors 92, 94, and 96, with VDDIO applied to the gate of transistor 96, transistor 96 is turned off, blocking VDDIO from the output of MUX3 (from the gate of NGH). The gate voltages on the transistors of MUX 3 are selected so as to prevent an SOA violations across any pair of terminals of these transistors. Therefore, REFH is provided to the gates of transistors 90, 92, and 94. Referring to MUX4, during normal operation, with VSS provided to the gates of transistors 98 and 102, these are on, providing REFH to the gate of PGM. With VSS applied to the gate of transistor 104, transistor 104 is off, blocking PAD from the gate of NGM. Also, by applying REFH to the gate of transistor 106, it is protected from SOA violations. As in MUX1 and MUX2, the gate voltages on any of the transistors are selected so as to prevent any SOA violations.

In an alternate embodiment, depending on the operating voltages and maximum allowable voltages for IO Circuit 10, rather than using three stacked devices for each of switches 12 and 14, greater or fewer stacked devices can be used. For example, in one embodiment in which each of switches 12 and 14 include only two stacked devices, PGL and NGL may not be present, such that PGM is connected between VDDIO and PGH, and NGM is connected between NGH and VSS. In this example, for the high impedance state of pad 44, VDDIO is applied to the gate of PGM and VSS to the gate of NGM. MUX1 still controls PGH_GATE and MUX3 still controls NGH_GATE. However, neither MUX2 nor MUX4 would be present in this embodiment. In this embodiment, each of MUX1 and MUX3 would bias PGH_GATE and NGH_GATE to prevent SOA violations during an OV or UV condition. Further, as described above with respect to FIGS. 3 and 4, the gate voltages of the transistors within MUX1 and MUX3 would be set during the occurrence of an OV condition or UV condition in such a way as to avoid SOA violations within the MUXes as well. For example, in this embodiment with two stacked devices for each switch, MUX1 and MUX3 could be implemented the same way as illustrated in FIGS. 2-5.

While the combination of power switches 12 and 14 can be used to form an IO circuit such as IO circuit 10 as illustrated in the embodiment of FIG. 1, each of power switches 12 and 14 can be used in other applications, independently of each other or combined. For example, power switch 12 can operate, as needed, in an application to provide its output at VSS or the high impedance state, and power switch 14 can operate, as needed, in an application to provide its output at VDDIO or the high impedance state. In alternate embodiments, each of the analog MUXes (e.g. MUX1-MUX5) may more generally be referred to as analog switches.

By now it should be appreciated that there has been provided improved analog MUX designs which eliminate SOA violations which can occur during OV or UV conditions. These OV or UV fault conditions may occur due to faults on a customer's PCB, which is out of the control of the SoC manufacturer. In one embodiment, a GPIO includes a pair of power switches in which each switch includes a set of stacked devices. In order to eliminate SOA violations, a gate voltage to a device of the stacked devices can be provided via an analog MUX which provides a desired gate voltage to the device based on whether an OV or UV condition is present, while appropriately blocking other voltages from the gate of the device. In doing so, appropriate gate voltages are provided to each device within the analog MUX to prevent SOA violations, regardless of whether or not an OV condition is present or a UV condition is present.

The semiconductor substrate of the devices described herein can be any semiconductor material or combinations of materials, such as gallium arsenide, silicon germanium, silicon-on-insulator (SOI), silicon, monocrystalline silicon, the like, and combinations of the above. In one embodiment, the devices are implemented as finFET devices.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "b" following the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the analog switches or MUXs can be implemented using different, fewer, or additional circuit elements or different layouts to provide the needed functionality. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In one embodiment, a power switch includes a first transistor of a first conductivity type having a first current electrode corresponding to a pad of the power switch and a second current electrode; a second transistor of the first conductivity type having a first current electrode coupled to the second current electrode of the first transistor and a second current electrode configured to receive a first power supply voltage; and an analog multiplexer (MUX). The analog MUX is configured to provide a pad voltage to a control electrode of the first transistor when an overvoltage (OV) condition is detected on the pad; a second power supply voltage to the control electrode of the first transistor when an undervoltage (UV) condition is detected on the pad; and a reference voltage to the control electrode of the first transistor when neither the UV condition nor the OV condition is detected on the pad, wherein the first power supply voltage is greater than the second power supply voltage, and the reference voltage is a fraction of the first power supply voltage. In one aspect, an OV condition is detected when the pad voltage exceeds the first power supply voltage, and a UV condition is detected when the pad voltage falls below the second power supply voltage. In another aspect, when the second transistor is off, the power switch is disabled such that the pad is in a high impedance state (Z). In yet an other aspect, the analog MUX includes a first branch coupled between the second supply voltage and the control electrode of the first transistor, and having a first plurality of transistors of a second conductivity type, opposite the first conductivity type, coupled in series; a second branch coupled between the pad and the control electrode of the first transistor, and having a second plurality of transistors of the first conductivity type coupled in series; and a third branch coupled between the reference voltage and the control electrode of the first transistor, and having at least one transistor of the first conductivity type coupled in series with at least one transistor of the second conductivity type. In a further aspect, a transistor of the second plurality of transistors has a first current electrode directly connected to the pad, and has a control electrode coupled to an output of a second analog MUX. In yet a further aspect, the second analog MUX is configured to provide the first supply voltage at its output when the OV condition is detected, and provide the second supply voltage at its output when the UV condition is detected. In yet a further aspect, the second analog MUX is further configured to provide the reference voltage at its output when neither the OV nor UV condition is detected. In yet an even further aspect, the power switch further includes a third transistor of the first conductivity type coupled between the second and first transistors, and having a first current electrode coupled to the second current electrode of the first transistor, and a second current electrode coupled to the first current electrode of the second transistor; and a third analog MUX configured to provide the pad voltage to a control electrode of the third transistor when the OV condition is detected on the pad; and the reference voltage to the control electrode of the third transistor when the UV condition is detected or when neither the UV nor OV condition is detected. In yet a further aspect, the third analog MUX includes a first branch coupled between the pad and the control electrode of the third transistor, and having a third plurality of transistors of the first conductivity type coupled in series, and a second branch coupled between the reference voltage, and having a fourth plurality of transistors of the second conductivity type coupled in series, wherein a transistor of the third plurality of transistors has a first current electrode directly connected to the pad, and has a control electrode coupled to the output of a second analog MUX. In another aspect, the first plurality of transistors includes a first transistor whose control electrode receives a first signal which toggles between the reference voltage and the second power supply voltage, and a second transistor whose control electrode receives a second signal which toggles between the reference voltage and the first power supply voltage. In yet another aspect, the second plurality of transistors includes a transistor of the first conductivity type coupled in series between two transistors of the second conductivity type.

In another embodiment, a power switch includes a first transistor of a first conductivity type having a first current electrode corresponding to a pad of the power switch and a second current electrode; a second transistor of the first conductivity type having a first current electrode coupled to the second current electrode of the first transistor and a second current electrode configured to receive a first power supply voltage; and an analog multiplexer (MUX). The analog MUX is configured to provide a second power supply voltage to a control electrode of the first transistor when an overvoltage (OV) condition is detected on the pad; a pad voltage on the pad to the control electrode of the first transistor when an undervoltage (UV) condition is detected on the pad; and a reference voltage to the control electrode of the first transistor when neither the UV condition nor the OV condition is detected on the pad, wherein the second power supply voltage is greater than the first power supply voltage, and the reference voltage is a fraction of the second power supply voltage. In one aspect of the another embodiment, the analog MUX includes a first branch coupled between the second supply voltage and the control electrode of the first transistor, and having a first plurality of transistors of a second conductivity type, opposite the first conductivity type, coupled in series; a second branch coupled between the pad and the control electrode of the first transistor, and having a second plurality of transistors of the first conductivity type coupled in series; and a third branch coupled between the reference voltage and the control electrode of the first transistor, and having at least one transistor of the first conductivity type coupled in series with at least one transistor of the second conductivity type. In a further aspect, a transistor of the second plurality of transistors has a first current electrode directly connected to the pad, and has a control electrode coupled to an output of a second analog MUX. In yet a further aspect, the second analog MUX is configured to provide the second supply voltage at its output when the OV condition is detected, and provide the first supply voltage at its output when the UV condition is detected. In yet an even further aspect, the power switch further includes a third transistor of the first conductivity type coupled between the first and second transistors, and having a first current electrode coupled to the second current electrode of the first transistor, and a second current electrode coupled to the first current electrode of the second transistor; and a third analog MUX configured to provide the pad voltage to a control electrode of the third transistor when the UV condition is detected on the pad; and the reference voltage to the control electrode of the third transistor when the OV condition is detected or when neither the UV nor OV condition is detected. In yet a further aspect, the third analog MUX includes a first branch having a third plurality of transistors of the first conductivity type coupled in series, and a second branch having a fourth plurality of transistors of the second conductivity type coupled in series, wherein a transistor of the third plurality of transistors has a first current electrode directly connected to the pad, and has a control electrode coupled to the output of a second analog MUX.

In yet another embodiment, an input/output (IO) circuit, having an IO pad, includes a first transistor of a first conductivity type having a first current electrode coupled to the IO pad; a second transistor of the first conductivity type having a first current electrode coupled to a second current electrode of the first transistor and a second current electrode configured to receive a first power supply voltage; a third transistor of a second conductivity type, opposite the first conductivity type, and having a first current electrode coupled to the IO pad; a fourth transistor of the second conductivity type having a first current electrode coupled to a second current electrode of the third transistor and a second current electrode configured to receive a second power supply voltage; a first analog multiplexer (MUX), and a second analog MUX. The first analog MUX is configured to provide a pad voltage on the IO pad to a control electrode of the first transistor when an overvoltage (OV) condition is detected on the pad; a second power supply voltage to the control electrode of the first transistor when an undervoltage (UV) condition is detected on the pad; and a first reference voltage to the control electrode of the first transistor when neither the UV condition nor OV condition is detected on the IO pad, wherein the first power supply voltage is greater than the second power supply voltage, and the reference voltage is a fraction of the first power supply voltage. The second analog MUX is configured to provide the first power supply voltage to a control electrode of the third transistor when the OV condition is detected on the pad; the pad voltage on the IO pad to the control electrode of the third transistor when the UV condition is detected on the pad; and a second reference voltage to the control electrode of the third transistor when neither the UV condition nor OV condition is detected on the IO pad. The first power supply voltage is greater than the second power supply voltage, the reference voltage is a first fraction of the first power supply voltage, and the second reference voltage is a second fraction of the first power supply voltage. In one aspect of the yet another embodiment, the IO circuit further includes a fifth transistor of the first conductivity type coupled between the second and first transistors, and having a first current electrode coupled to the second current electrode of the first transistor, and a second current electrode coupled to the first current electrode of the second transistor; a sixth transistor of the second conductivity type coupled between the third and fourth transistors, and having a first current electrode coupled to the second current electrode of the third transistor, and a second current electrode coupled to the first current electrode of the fourth transistor; a third analog MUX; and a fourth analog MUX. The third analog MUX is configured to provide the pad voltage to a control electrode of the fifth transistor when the OV condition is detected on the pad; and the first reference voltage to the control electrode of the fifth transistor when the UV condition is detected or when neither the UV nor OV condition is detected. The fourth analog MUX is configured to provide the pad voltage to a control electrode of the sixth transistor when the UV condition is detected on the pad; and the second reference voltage to the control electrode of the sixth transistor when the OV condition is detected or when neither the UV nor OV condition is detected. In a further aspect, the IO circuit further includes a fifth analog MUX having an output coupled to a control electrode of a transistor in each of the first, second, third, and fourth analog MUXes which has a first current electrode directly connected to the pad, wherein the fifth analog MUX is configured to provide the first supply voltage at its output when the OV condition is detected, and provide the second supply voltage at its output when the UV condition is detected.

What is claimed is:

1. A power switch, comprising:
a first transistor of a first conductivity type having a first current electrode corresponding to a pad of the power switch and a second current electrode;
a second transistor of the first conductivity type having a first current electrode coupled to the second current electrode of the first transistor and a second current electrode configured to receive a first power supply voltage; and
an analog multiplexer (MUX) configured to provide:
a pad voltage to a control electrode of the first transistor when an overvoltage (OV) condition is detected on the pad;
a second power supply voltage to the control electrode of the first transistor when an undervoltage (UV) condition is detected on the pad; and
a reference voltage to the control electrode of the first transistor when neither the UV condition nor the OV condition is detected on the pad, wherein the first power supply voltage is greater than the second power supply voltage, and the reference voltage is a fraction of the first power supply voltage,
wherein the analog MUX comprises:
a first branch coupled between the second supply voltage and the control electrode of the first transistor, and comprising a first plurality of transistors of a second conductivity type, opposite the first conductivity type, coupled in series;
a second branch coupled between the pad and the control electrode of the first transistor, and comprising a second plurality of transistors of the first conductivity type coupled in series; and
a third branch coupled between the reference voltage and the control electrode of the first transistor, and comprising at least one transistor of the first conductivity type coupled in series with at least one transistor of the second conductivity type.

2. The power switch of claim 1, wherein an OV condition is detected when the pad voltage exceeds the first power supply voltage, and a UV condition is detected when the pad voltage falls below the second power supply voltage.

3. The power switch of claim 1, wherein when the second transistor is off, the power switch is disabled such that the pad is in a high impedance state (Z).

4. The power switch of claim 1, wherein:
a transistor of the second plurality of transistors has a first current electrode directly connected to the pad, and has a control electrode coupled to an output of a second analog MUX.

5. The power switch of claim 4, wherein the second analog MUX is configured to:
provide the first supply voltage at its output when the OV condition is detected, and
provide the second supply voltage at its output when the UV condition is detected.

6. The power switch of claim 5, wherein the second analog MUX is further configured to provide the reference voltage at its output when neither the OV nor UV condition is detected.

7. The power switch of claim 6, further comprising:
a third transistor of the first conductivity type coupled between the second and first transistors, and having a first current electrode coupled to the second current electrode of the first transistor, and a second current electrode coupled to the first current electrode of the second transistor; and
a third analog MUX configured to provide:
the pad voltage to a control electrode of the third transistor when the OV condition is detected on the pad; and
the reference voltage to the control electrode of the third transistor when the UV condition is detected or when neither the UV nor OV condition is detected.

8. The power switch of claim 7, wherein the third analog MUX comprises:
a first branch coupled between the pad and the control electrode of the third transistor, and comprising a third plurality of transistors of the first conductivity type coupled in series, and
a second branch coupled between the reference voltage, and comprising a fourth plurality of transistors of the second conductivity type coupled in series,
wherein a transistor of the third plurality of transistors has a first current electrode directly connected to the pad, and has a control electrode coupled to the output of a second analog MUX.

9. The power switch of claim 1, wherein the first plurality of transistors includes a first transistor whose control electrode receives a first signal which toggles between the reference voltage and the second power supply voltage, and a second transistor whose control electrode receives a second signal which toggles between the reference voltage and the first power supply voltage.

10. The power switch of claim 1, wherein the second plurality of transistors includes a transistor of the first conductivity type coupled in series between two transistors of the second conductivity type.

11. A power switch, comprising:
a first transistor of a first conductivity type having a first current electrode corresponding to a pad of the power switch and a second current electrode;
a second transistor of the first conductivity type having a first current electrode coupled to the second current electrode of the first transistor and a second current electrode configured to receive a first power supply voltage; and an analog multiplexer (MUX) configured to provide:
a second power supply voltage to a control electrode of the first transistor when an overvoltage (OV) condition is detected on the pad;
a pad voltage on the pad to the control electrode of the first transistor when an undervoltage (UV) condition is detected on the pad; and
a reference voltage to the control electrode of the first transistor when neither the UV condition nor the OV condition is detected on the pad, wherein the second power supply voltage is greater than the first power supply voltage, and the reference voltage is a fraction of the second power supply voltage,
wherein the analog MUX comprises:
a first branch coupled between the second supply voltage and the control electrode of the first transistor, and comprising a first plurality of transistors of a second conductivity type, opposite the first conductivity type, coupled in series;
a second branch coupled between the pad and the control electrode of the first transistor, and comprising a second plurality of transistors of the first conductivity type coupled in series; and
a third branch coupled between the reference voltage and the control electrode of the first transistor, and comprising at least one transistor of the first conductivity type coupled in series with at least one transistor of the second conductivity type.

12. The power switch of claim 11, wherein:
a transistor of the second plurality of transistors has a first current electrode directly connected to the pad, and has a control electrode coupled to an output of a second analog MUX.

13. The power switch of claim 12, wherein the second analog MUX is configured to:
provide the second supply voltage at its output when the OV condition is detected, and
provide the first supply voltage at its output when the UV condition is detected.

14. The power switch of claim 13, further comprising:
a third transistor of the first conductivity type coupled between the first and second transistors, and having a first current electrode coupled to the second current electrode of the first transistor, and a second current electrode coupled to the first current electrode of the second transistor; and
a third analog MUX configured to provide:
the pad voltage to a control electrode of the third transistor when the UV condition is detected on the pad; and
the reference voltage to the control electrode of the third transistor when the OV condition is detected or when neither the UV nor OV condition is detected.

15. The power switch of claim 14, wherein the third analog MUX comprises:
a first branch comprising a third plurality of transistors of the first conductivity type coupled in series, and
a second branch comprising a fourth plurality of transistors of the second conductivity type coupled in series,
wherein a transistor of the third plurality of transistors has a first current electrode directly connected to the pad, and has a control electrode coupled to the output of a second analog MUX.

16. An input/output (IO) circuit having an IO pad, the IO circuit comprising:
a first transistor of a first conductivity type having a first current electrode coupled to the IO pad;
a second transistor of the first conductivity type having a first current electrode coupled to a second current electrode of the first transistor and a second current electrode configured to receive a first power supply voltage;
a third transistor of a second conductivity type, opposite the first conductivity type, and having a first current electrode coupled to the IO pad;
a fourth transistor of the second conductivity type having a first current electrode coupled to a second current electrode of the third transistor and a second current electrode configured to receive a second power supply voltage;
a first analog multiplexer (MUX) configured to provide:
a pad voltage on the IO pad to a control electrode of the first transistor when an overvoltage (OV) condition is detected on the pad;
a second power supply voltage to the control electrode of the first transistor when an undervoltage (UV) condition is detected on the pad; and
a first reference voltage to the control electrode of the first transistor when neither the UV condition nor OV condition is detected on the IO pad, wherein the first power supply voltage is greater than the second power supply voltage, and the first reference voltage is a fraction of the first power supply voltage;
a second analog multiplexer (MUX) configured to provide:
the first power supply voltage to a control electrode of the third transistor when the OV condition is detected on the pad;
the pad voltage on the IO pad to the control electrode of the third transistor when the UV condition is detected on the pad; and
a second reference voltage to the control electrode of the third transistor when neither the UV condition nor OV condition is detected on the IO pad, and the second reference voltage is a second fraction of the first power supply voltage;
a fifth transistor of the first conductivity type coupled between the second and first transistors, and having a first current electrode coupled to the second current electrode of the first transistor, and a second current electrode coupled to the first current electrode of the second transistor;
a sixth transistor of the second conductivity type coupled between the third and fourth transistors, and having a first current electrode coupled to the second current electrode of the third transistor, and a second current electrode coupled to the first current electrode of the fourth transistor;
a third analog MUX configured to provide:
the pad voltage to a control electrode of the fifth transistor when the OV condition is detected on the pad; and
the first reference voltage to the control electrode of the fifth transistor when the UV condition is detected or when neither the UV nor OV condition is detected; and
a fourth analog MUX configured to provide:
the pad voltage to a control electrode of the sixth transistor when the UV condition is detected on the pad; and the second reference voltage to the control electrode of the sixth transistor when the OV condition is detected or when neither the UV nor OV condition is detected.

17. The IO circuit of claim 16 further comprising a fifth analog MUX having an output coupled to a control electrode of a transistor in each of the first, second, third, and fourth analog MUXes which has a first current electrode directly connected to the pad, wherein the fifth analog MUX is configured to:
provide the first supply voltage at its output when the OV condition is detected, and
provide the second supply voltage at its output when the UV condition is detected.

* * * * *